(12) United States Patent
Nagata (10) Patent No.: US 8,261,435 B2
(45) Date of Patent: Sep. 11, 2012

(54) PRINTED WIRING BOARD AND METHOD FOR MANUFACTURING THE SAME

(75) Inventor: Hiroyasu Nagata, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 373 days.

(21) Appl. No.: 12/606,593

(22) Filed: Oct. 27, 2009

(65) Prior Publication Data

US 2010/0163290 A1  Jul. 1, 2010

Related U.S. Application Data

(60) Provisional application No. 61/141,143, filed on Dec. 29, 2008.

(51) Int. Cl.
*H05K 3/30* (2006.01)
(52) U.S. Cl. ............... 29/834; 29/832; 29/841; 29/846; 29/852; 156/273.9; 156/701; 156/719
(58) Field of Classification Search .............. 29/832, 29/834, 841, 846, 852; 156/273.9, 701, 719; 438/106, 118, 125, 126, 127
See application file for complete search history.

(56) References Cited

U.S. PATENT DOCUMENTS

| 2005/0093117 A1* | 5/2005 | Masuda et al. ............... 257/676 |
| 2008/0201944 A1* | 8/2008 | Sakamoto et al. ............. 29/846 |
| 2008/0277150 A1* | 11/2008 | Takashima et al. ........... 174/260 |

FOREIGN PATENT DOCUMENTS

WO  WO 2007/107630 A1  9/2007

* cited by examiner

*Primary Examiner* — A. Dexter Tugbang
*Assistant Examiner* — Jeffrey T Carley
(74) *Attorney, Agent, or Firm* — Oblon, Spivak, McClelland, Maier & Neustadt, L.L.P.

(57) ABSTRACT

A method for manufacturing printed wiring board including preparing an electronic component having first and second surfaces and electrode on the first surface, forming in an adhesive tape a mark, mounting based on the mark the component on the tape such that the second surface faces the adhesive of the tape, forming another mark on insulative substrate having first and second surfaces, forming in the substrate an opening larger than the component, mounting based on the marks the substrate on the tape such that the component is in the opening of the substrate, fixing the component to the substrate using resin, forming an insulation layer on the first surface of the substrate where the component is accommodated, removing the tape, forming in the layer an opening reaching the electrode, forming a conductive circuit on the layer, and forming in the opening of the layer a via connected to the electrode.

14 Claims, 9 Drawing Sheets

PRINTED WIRING BOARD AND METHOD FOR MANUFACTURING THE SAME

CROSS-REFERENCE TO RELATED APPLICATIONS

The present application claims the benefits of priority to U.S. Application No. 61/141,143, filed Dec. 29, 2008. The contents of that application are incorporated herein by reference in their entirety.

BACKGROUND OF THE INVENTION

1. Field of the Invention

The present invention is related to a printed wiring board with a built-in electronic component and its manufacturing method. As for the built-in electronic component, for example, active components such as IC chips made of semiconductor elements, or passive components such as resistors, capacitors or coils are listed.

2. Discussion of the Background

WO2007/107630, the content of which are incorporated herein by reference in their entirety, describes a method for mounting an IC chip on a support plate where an adhesive is applied, laminating resin insulation layers, and then removing the support plate.

SUMMARY OF THE INVENTION

A method for manufacturing a printed wiring board according to one aspect of the present invention includes the following: preparing an electronic component having a first surface and a second surface opposite the first surface, and having a first electrode formed on the first surface; in adhesive tape, forming a first alignment mark for mounting the electronic component; based on the first alignment mark, mounting the electronic component on the adhesive tape in such a way that its second surface faces the adhesive side of the adhesive tape; forming a second alignment mark on an insulative substrate having a first surface and a second surface opposite the first surface; in the insulative substrate, forming an opening section larger than the external shape of the electronic component; based on the first and second alignment marks, mounting the insulative substrate on the adhesive side of the adhesive tape in such a way that the electronic component is accommodated in the opening section of the insulative substrate; fixing the electronic component to the insulative substrate using resin material; forming a first resin insulation layer on the first surface of the insulative substrate in which the electronic component is accommodated; removing the adhesive tape; in the first resin insulation layer, forming an opening that reaches the first electrode of the electronic component; forming a first conductive circuit on the first resin insulation layer; and in the opening of the first resin insulation layer, forming a via conductor that is connected to the first electrode of the electronic component.

A method for manufacturing a printed wiring board according to another aspect of the present invention includes the following: preparing an electronic component having a first surface and a second surface opposite the first surface, and having a first electrode formed on the first surface; in an adhesive tape, forming a first alignment mark for mounting the electronic component; based on the first alignment mark, mounting the electronic component on the adhesive tape in such a way that its second surface faces the adhesive side of the adhesive tape; forming a second alignment mark on an insulative substrate having a first surface and a second surface opposite the first surface; in the insulative substrate, forming an opening section larger than the external shape of the electronic component; based on the first and second alignment marks, mounting the insulative substrate on the adhesive side of the adhesive tape in such a way that the electronic component is accommodated in the opening section of the insulative substrate; fixing the electronic component to the insulative substrate using resin material; removing the adhesive tape; forming a first resin insulation layer and a second resin insulation layer on the first and second surfaces respectively of the insulative substrate in which the electronic component is accommodated; in the first resin insulation layer, forming an opening that reaches the first electrode of the electronic component; forming a through-hole that penetrates the first and second resin insulation layers and the insulative substrate; and forming a first conductive circuit and a second conductive circuit on the first and second resin insulation layers respectively, while forming in the opening of the first resin insulation layer a via conductor that connects the first conductive circuit and the first electrode of the electronic component, and forming on the inner wall of the through-hole a through-hole conductor that connects the first and second conductive circuits.

Also, a printed wiring board according to yet another aspect of the present invention includes a core substrate having a first surface and a second surface opposite the first surface, and an opening section larger than the outer diameter of an electronic component to be accommodated; an electronic component accommodated in the opening section, having a first surface and a second surface opposite the first surface, and having a first electrode formed on the first surface; a first resin insulation layer formed on the first surface of the core substrate; a first conductive circuit formed on the first resin insulation layer; and in the first resin insulation layer, a first via conductor which is formed in an opening reaching the first electrode of the electronic component, and which connects the first conductive circuit and the first electrode. The gaps between the electronic component and the inner walls of the opening section of the core substrate are filled with resin made up of resin material and resin ingredients drained from the first resin insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1:
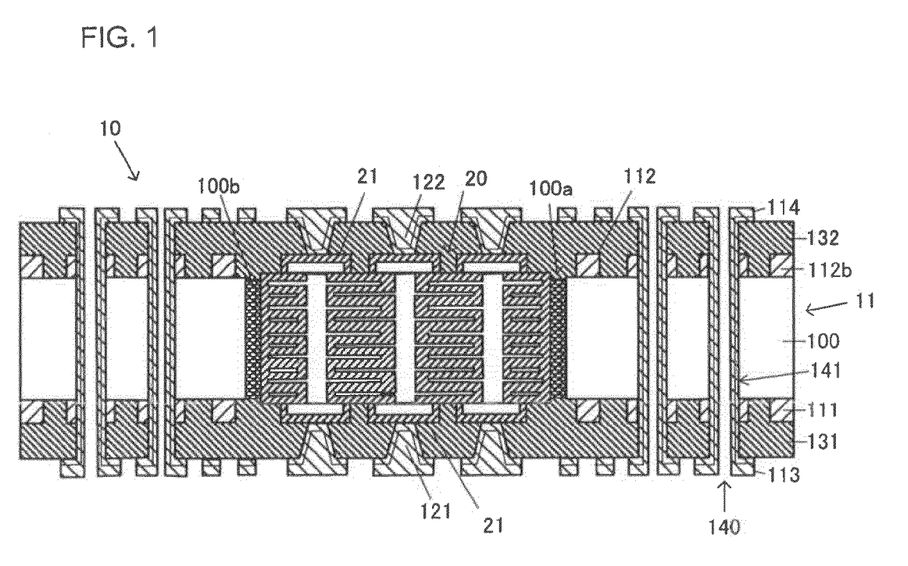
FIG. 1 is a cross-sectional view schematically showing a printed wiring board according to an embodiment of the present invention.

As shown in FIG. 1, printed wiring board 10 according to the present embodiment is mainly formed with core substrate 11, chip capacitor 20, resin insulation layers 131, 132 laminated respectively on both surfaces of core substrate 11 and chip capacitor 20, and conductive patterns (conductive circuits) 113, 114 formed respectively on resin insulation layers 131, 132.

Core substrate 11 has rigid base material 100, and on both main surfaces of rigid base material 100, conductive patterns (conductive circuits) 111, 112 made of, for example, copper are formed. Conductive patterns 111, 112 are electrically connected to further upper-layer conductive patterns at their respective predetermined spots. As for rigid base material 100, the following may be used: namely, glass cloth or the like with an approximate thickness of 0.1-1.0 mm impregnated with resin such as BT (bismaleimide triazine) resin or epoxy resin, which is then cured.

In rigid base material 100, opening section (100a) is formed, and chip capacitor 20 is arranged in opening section (100a). Gaps between chip capacitor 20 and rigid base material 100 are filled with filler resin (100b), which secures chip capacitor 20. As such, chip capacitor 20 is built (embedded) in core substrate 11. As for material for filler resin (100b), it is efficient to use material such as that having lower coefficients of elasticity and thermal expansion than at least those of the material forming rigid base material 100. Specifically, for example, bismaleimide resin containing fumed silica and polytetrafluoroethylene (PTFE) as filler may be used.

On both main surfaces of core substrate 11, resin insulation layers 131, 132 are laminated. As for material forming resin insulation layers 131, 132, for example, thermosetting resins such as epoxy resin, BT resin, polyimide resin, olefin resin or the like, or a composition of thermosetting resins and thermoplastic resins, may be used.

Conductive patterns 113, 114 and terminals 21 of chip capacitor 20 are electrically connected by means of via conductors 121, 122. Via conductors 121, 122 are filled vias made by filling via holes with copper plating or the like.

Also, in printed wiring board 10, through-holes 140 are formed. Conductive pattern 113 and conductive pattern 114 are electrically connected by means of through-hole conductors 141.

Printed wiring board 10 functions as an electronic device by electrically connecting conductive patterns 113, 114 to further upper-layer conductive patterns according to requirements, or by being mounted on a motherboard or the like through flip-chip connection or wire bonding.

Figure 2A:
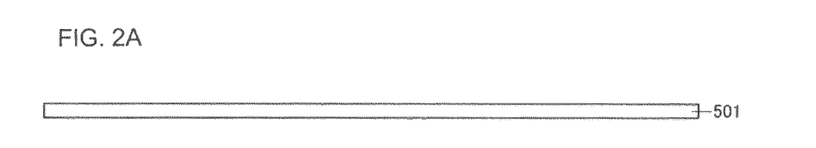
FIG. 2A is a cross-sectional view showing a first step to mount a chip capacitor on an adhesive sheet.
Figure 2B:
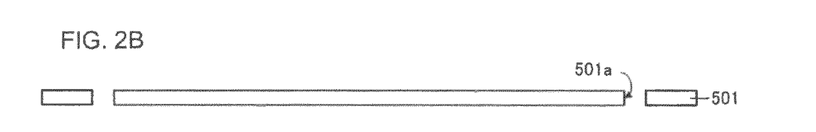
FIG. 2B is a cross-sectional view showing a second step to mount a chip capacitor on the adhesive sheet.
Figure 2C:
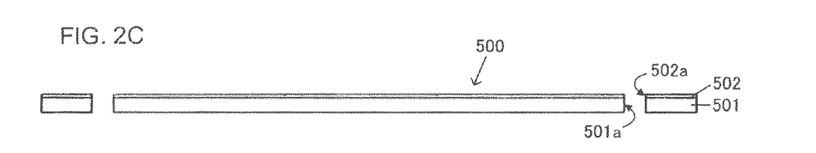
FIG. 2C is a cross-sectional view showing a third step to mount a chip capacitor on the adhesive sheet.

When manufacturing such printed wiring board 10, first as shown in FIG. 2A, rectangular jig plate 501 (a support plate) made of metal, for example, is prepared. Then, as shown in FIG. 2B, alignment marks (501a) for determining positions are formed by making through-holes at four corners of jig plate 501 using, for example, a drill or the like. In the following, alignment marks (502a) are also formed in adhesive layer 502 made of, for example, a UV tape having adhesiveness on both sides. Then, as shown in FIG. 2C, based on alignment marks (501a, 502a), adhesive layer 502 is laminated on one main surface of jig plate 501. Accordingly, adhesive sheet 500 with an adhesive surface is formed.

As for jig plate 501, for example, a metal plate or a resin plate may be used. In addition, as for adhesive layer 502, any type of adhesive material may be used. Also, adhesive layer 502 does not have to be formed on the entire main surface of jig plate 501, but for example, adhesive layer 502 may be formed only in a partial region on the main surface. Furthermore, alignment marks (501a, 502a) may also be any type other than through-holes, as long as they can be recognized (for example, optically recognized) at the time of alignment. If the alignment marks are configured to be through-holes, then pins or the like may be inserted into such through-holes, and based on such pins, jig plate 501 and adhesive layer 502 may be laminated.

Figure 2D:
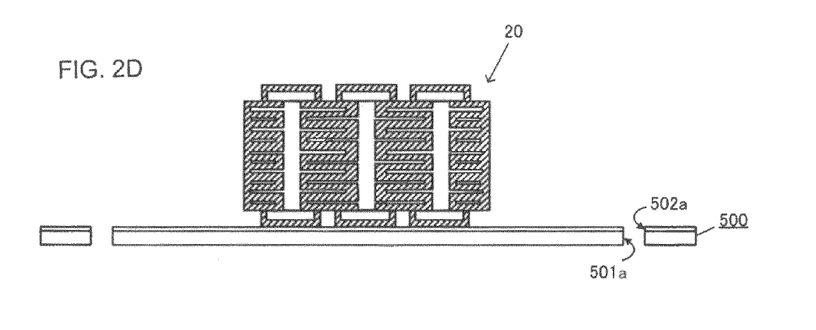
FIG. 2D is a cross-sectional view showing a fourth step to mount a chip capacitor on the adhesive sheet.

Next, as shown in FIG. 2D, by aligning based on alignment marks (501a), chip capacitor 20 is mounted on adhesive sheet 500. In doing so, chip capacitor 20 is fixed to adhesive sheet 500.

Figure 3A:
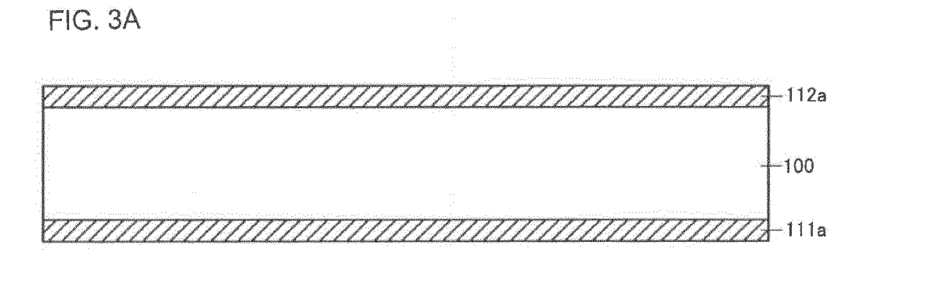
FIG. 3A is a cross-sectional view showing a first step to form a core substrate.
Figure 3B:
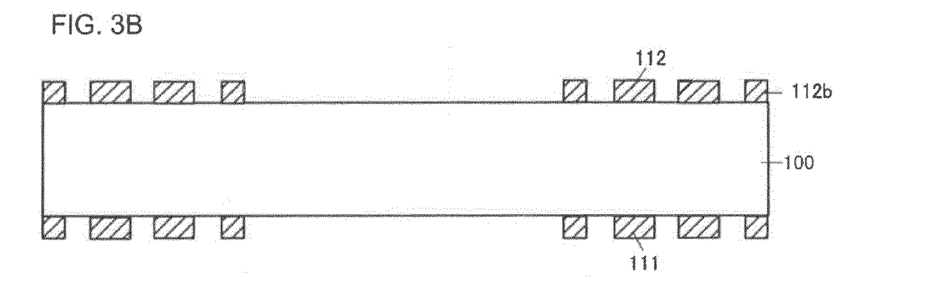
FIG. 3B is a cross-sectional view showing a second step to form a core substrate.

Here, before describing the next step, a step conducted prior to the step, namely a step to manufacture core substrate 11, is described. When manufacturing core substrate 11, first, as shown in FIG. 3A, for example, conductive films (111a, 112) made of copper, for example, are formed (for example, laminated) on both main surfaces of rigid base material 100 respectively. After that, by conducting, for example, a predetermined lithography process (preliminary treatment, laminating, exposing and developing, etching, removing the film, inner-layer inspection and so forth), conductive films (111a, 112a) are patterned. Accordingly, conductive patterns 111, 112 and alignment marks (112b) are formed as shown in FIG. 3B, for example.

Figure 3C:
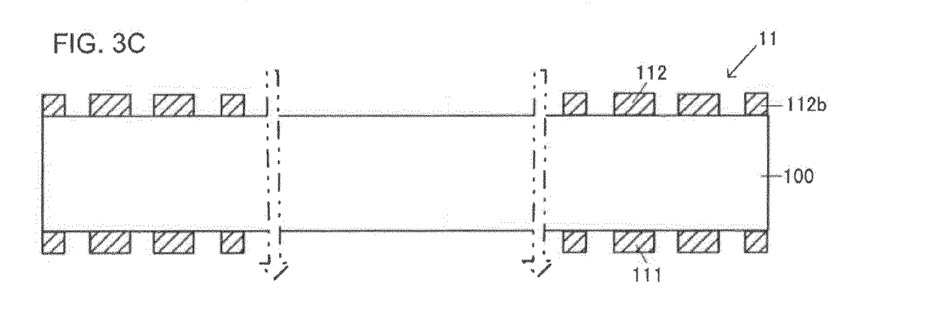
FIG. 3C is a cross-sectional view showing a third step to form a core substrate.

In the following, based on alignment marks (112b), opening section (100a), into which chip capacitor 20 will be built, is formed (drilled) at the predetermined section of rigid base material 100 using a drill or the like as shown in FIG. 3C, for example. Accordingly, core substrate 11 is obtained as shown in FIG. 3D.

Figure 3D:
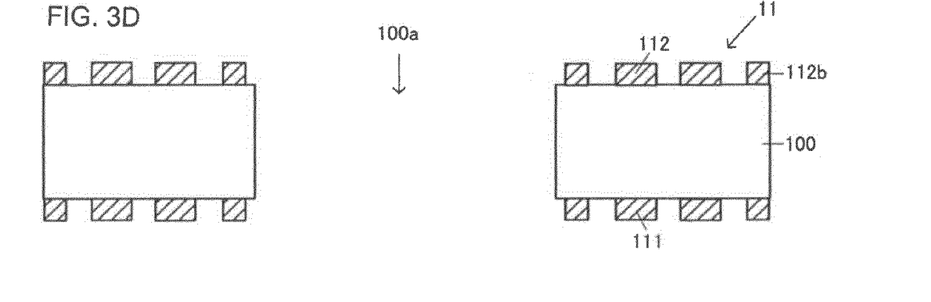
FIG. 3D is a cross-sectional view showing a fourth step to form a core substrate.
Figure 4A:
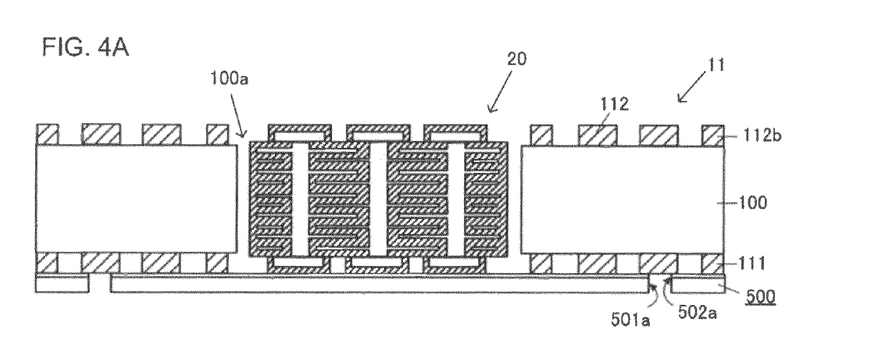
FIG. 4A is a cross-sectional view showing a first step to fix a chip capacitor to the core substrate.

In the next step, core substrate 11 shown in FIG. 3D is mounted on adhesive sheet 500 in such a way that chip capacitor 20 will be accommodated in opening section (100a). At that time, based on alignment marks (501a, 502a) and alignment marks (112b) of core substrate 11, chip capacitor 20 is aligned so that it will be arranged in opening section (100a). In doing so, as shown in FIG. 4A, core substrate 11, as well as chip capacitor 20, is adhered and fixed to adhesive sheet 500. Since core substrate 11 and chip capacitor 20 are aligned based on alignment marks (501a, 502a), chip capacitor 20 may be accurately positioned inside opening section (100a) of core substrate 11.

Figure 4B:
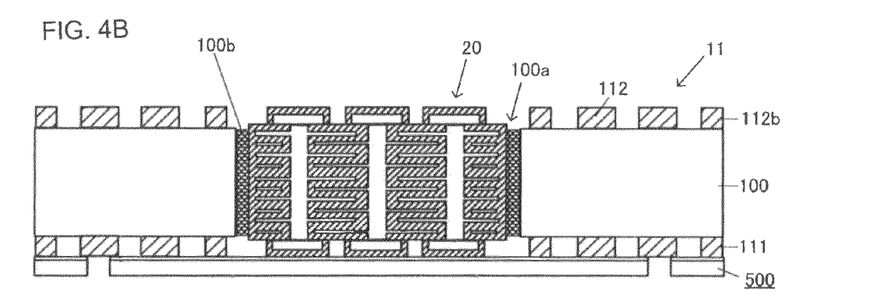
FIG. 4B is a cross-sectional view showing a second step to fix a chip capacitor to the core substrate.

Next, as shown in FIG. 4B, by vacuum printing (applying in a vacuum condition) for example, gaps between chip capacitor 20 and the inner walls of core substrate 11 in opening section (100a) are filled with filler resin (100b). As for the material for filler resin (100b), for example bismaleimide resin is used which contains fumed silica and PTFE as filler. Any method is used for filling filler resin 100; for example, it may be injected using a dispenser. However, vacuum printing is preferred to suppress voids or the like.

At that point, glass cloth or the like contained in core substrate 11 is preferred to protrude slightly from the wall surface of opening portion (100a). Under such a condition, adhesiveness between filler resin (100b) and core substrate 11 will be further enhanced.

Figure 4C:
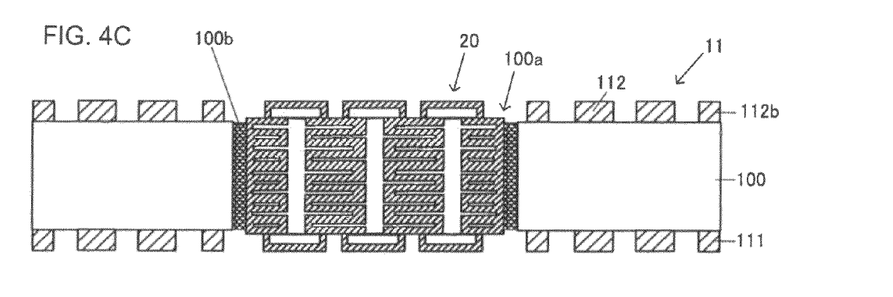
FIG. 4C is a cross-sectional view showing a third step to fix a chip capacitor to the core substrate.

After that, filler resin (100b) is semi-cured or completely cured by curing (thermal treatment). In the following, as shown in FIG. 4C, for example, adhesive sheet 500 is peeled and removed from core substrate 11 and chip capacitor 20.

The conditions for curing (thermal treatment) of filler resin (100b) are 150° C. for 60 minutes, for example. In addition, properties of filler resin (100b) after curing are preferred to be set as follows: namely, elastic modulus (by a DMA) of 0.5 GPa (−40° C.), 0.11 GPa (25° C.) and 0.05 GPa (150° C.); glass transition temperature Tg (by a TMA) of −70° C.; and coefficient of thermal expansion (CTE (X,Y) α ½) of 59/130 (ppm/° C.)

Figure 5A:
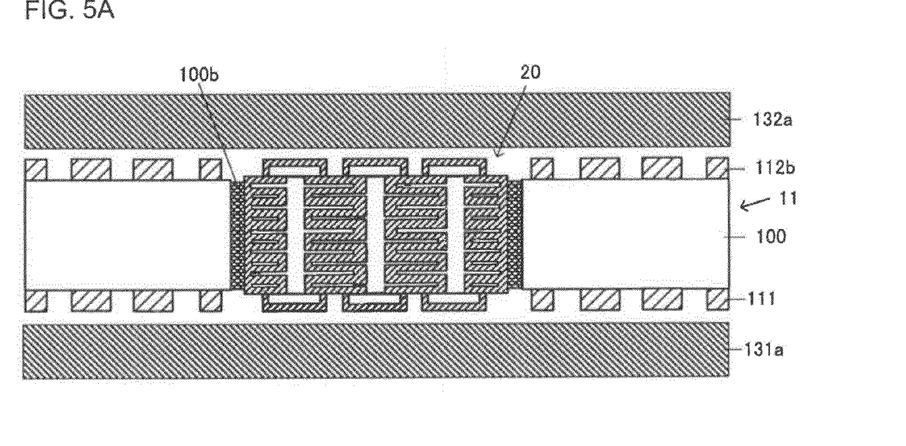
FIG. 5A is a cross-sectional view showing a first step to form resin insulation layers on the substrate shown in FIG. 4C.
Figure 5B:
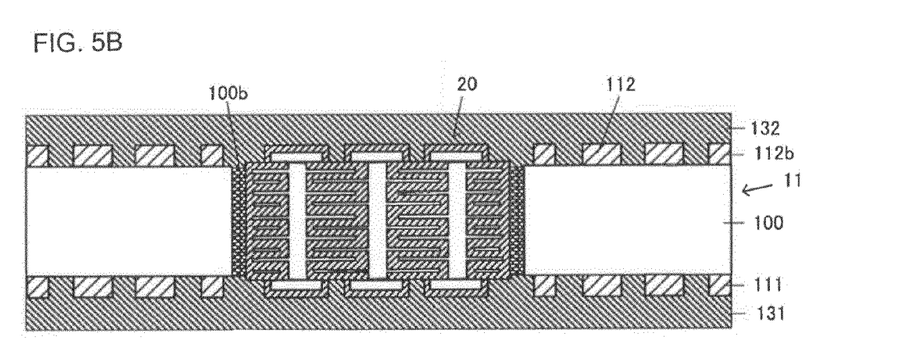
FIG. 5B is a cross-sectional view showing a second step to form resin insulation layers on the substrate shown in FIG. 4C.

In the following, each surface of conductive patterns 111, 112 is roughened. Then, on both surfaces of the resultant structure, thermosetting insulative resin films (131a, 132a) are arranged as shown in FIG. 5A, for example, and thermopressed (laminated) using a vacuum laminator with thermo-pressing functions. Accordingly, resin insulation layers 131, 132 are formed as shown in FIG. 5B. At that point, since chip capacitor 20 is fixed to core substrate 11 by filler resin (100b), thermosetting insulative resin films (131a, 132a) may be laminated all at once on both surfaces of core substrate 11. During that time, since resin ingredients are drained out of thermosetting insulative resin films (131a, 132a), even if there are gaps between chip capacitor 20 and the inner walls of core substrate 11, the gaps are completely filled by such resin ingredients.

Figure 8A:
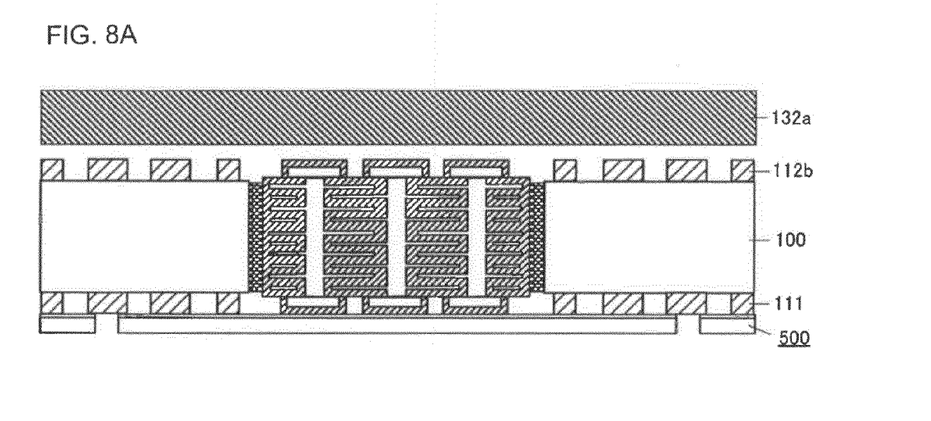
FIG. 8A is a cross-sectional view showing another example (a first step) to form a resin insulation layer.
Figure 8B:
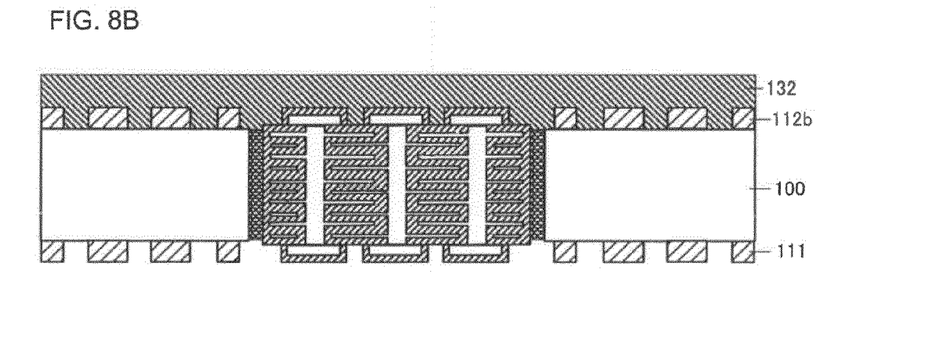
FIG. 8B is a cross-sectional view showing another example (a second step) to form a resin insulation layer.
Figure 8C:
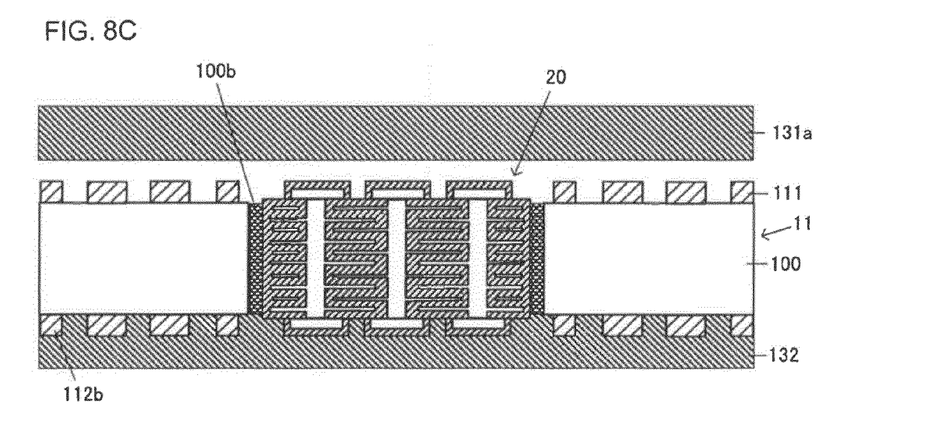
FIG. 8C is a cross-sectional view showing another example (a third step) to form a resin insulation layer.

Other than the above method for forming resin insulation layers 131, 132 shown in FIG. 4C through FIG. 5B, the following method may also be employed: namely, in a state with adhesive sheet 500 as shown in FIG. 4B, thermosetting insulative resin film (132a) is laminated on the upper surfaces of core substrate 11 and chip capacitor 20, and resin insulation layer 132 is formed accordingly (see FIG. 8A); and then, adhesive sheet 500 is removed (see FIG. 8B), core substrate 11 is inversed, thermosetting insulative resin film (131a) is laminated, and resin insulation layer 131 is formed accordingly (see FIG. 8C).

When resin insulation layers 131, 132 are formed as above, chip capacitor 20 is fixed to core substrate 11 by filler resin (100b). Thus, the positional shift of chip capacitor 20 during the lamination process may decrease. Also, since gaps between chip capacitor 20 and the inner walls of core substrate 11 in opening section (100a) are filled with filler resin (100b), resin insulation layers 131, 132 may be formed with excellent flatness. Also, since filler resin (100b) is made from material with a low thermal expansion coefficient, the positional shift of chip capacitor 20 caused by the thermosetting and heat contraction of resin may decrease. In addition, cracks or migration induced by stresses caused by voids may be suppressed.

Figure 6:
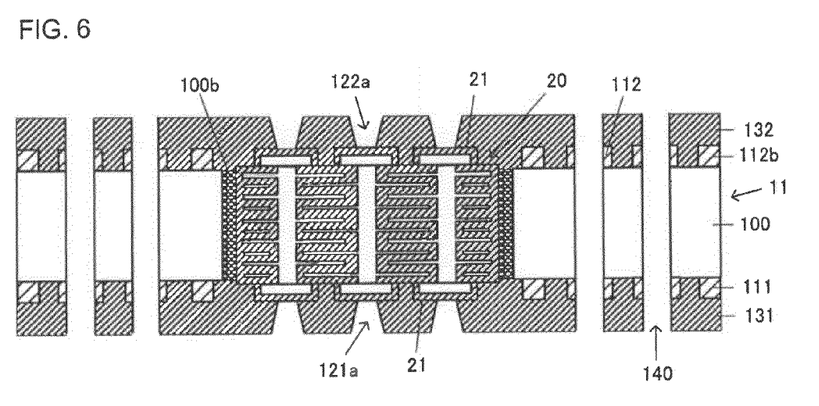
FIG. 6 is a cross-sectional view showing a step to form through-holes and via holes in the substrate shown in FIG. 5B.

In the following, after a predetermined preliminary treatment, as shown in FIG. 6, via holes (121a, 122a) reaching each terminal 21 of chip capacitor 20 are formed in resin insulation layers 131, 132 respectively by laser beaming, for example. In addition, through-holes 140 penetrating core substrate 11 and resin insulation layers 131, 132 are formed. Through-holes 140 are aligned based on conductive patterns 111, 112, for example.

Figure 7A:
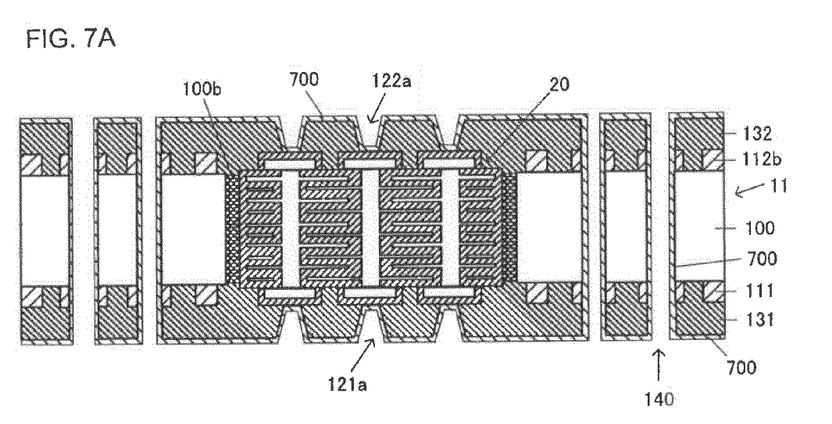
FIG. 7A is a cross-sectional view showing a step to form conductive patterns on the resin insulation layers.

Then, desmearing (removing smears) is conducted on the substrate shown in FIG. 6 using oxygen plasma (or a drug solution containing permanganic acid or the like). After that, the substrate is immersed in an electroless copper plating solution under the conditions of, for example, solution temperature 34° C. and time 40 minutes. As a result, on the surfaces of resin insulation layers 131, 132, on the inner surfaces of via holes (121a, 122a) and on the inner surfaces of through-holes 140, electroless copper-plated film 700 is formed with a thickness in the range of 0.6-3.0 μm (see FIG. 7A).

Figure 7B:
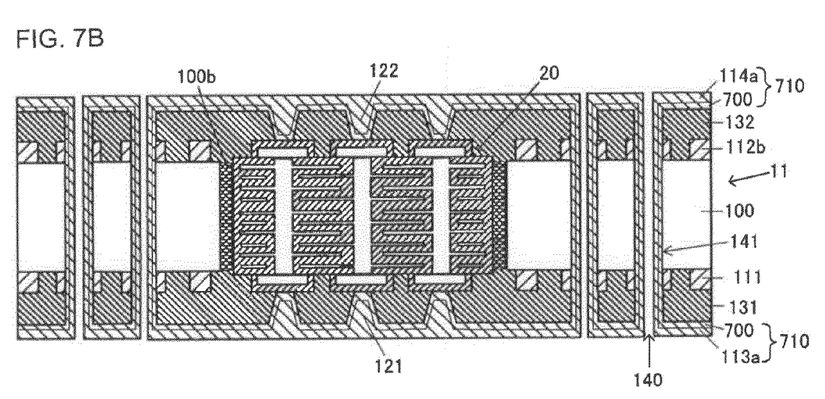
FIG. 7B is a cross-sectional view showing a step to form conductive patterns on the resin insulation layers.

In the following, electrolytic plating is performed by immersing the resultant substrate in an electrolytic plating solution under the conditions of, for example, current density 1.0 A/Dm2, temperature 22±2° C. and time 120 minutes. Accordingly, as shown in FIG. 7B, electrolytic copper-plated film (113a, 114a), via conductors 121, 122 and through-hole conductors 141 are formed. As so described, conductive layers 710 are formed which are made up of electroless plated film 700 and electrolytic copper-plated film (113a, 114a).

Figure 7C:
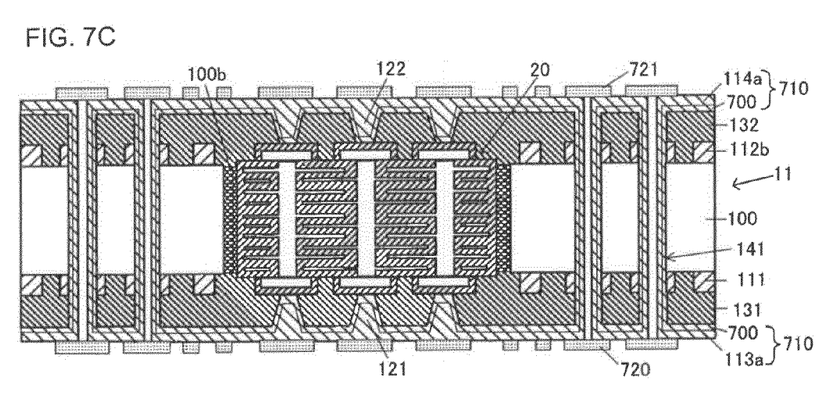
FIG. 7C is a cross-sectional view showing a step to form conductive patterns on the resin insulation layers.

In the following, as shown in FIG. 7C, by conducting a predetermined lithography process (preliminary treatment, laminating, exposing and developing), etching resists 720, 721 are formed. After that, conductive layers 710 are etched. By doing so, conductive patterns 113, 114 are formed and printed wiring board 10 is obtained as shown in FIG. 1.

The present invention is not limited to the above embodiment, but various modifications may be made within a scope that will not deviate from the gist of the present invention.

Figure 9A:
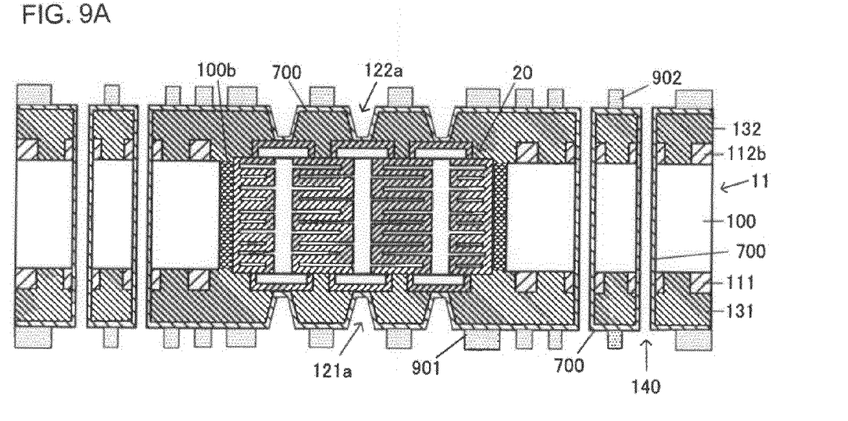
FIG. 9A is a cross-sectional view showing another example (a first step) to form conductive patterns on the resin insulation layers.

For example, in the above embodiment, conductive patterns 113, 114 are formed by a so-called tenting method, but they may also be formed by a semi-additive method. Steps for forming conductive patterns 113, 114 by a semi-additive method will be described briefly. First, electroless copper plating is performed on the substrate shown in FIG. 6 to form electroless copper-plated film 700 with a thickness of 0.6-3.0 μm on the surfaces of resin insulation layers 131, 132, on the inner surfaces of via holes (121a, 122a) and on the inner surfaces of through-holes 140 (see FIG. 7A). Next, on both main surfaces of the substrate shown in FIG. 7A, a dry-film photosensitive resist is laminated, and mask film is adhered on the photosensitive resist, which is then exposed and developed. Accordingly, plating resist layer 901 with openings only in areas corresponding to conductive pattern 113, and plating resist layer 902 with openings only in areas corresponding to conductive pattern 114, are formed (see FIG. 9A).

Figure 9B:
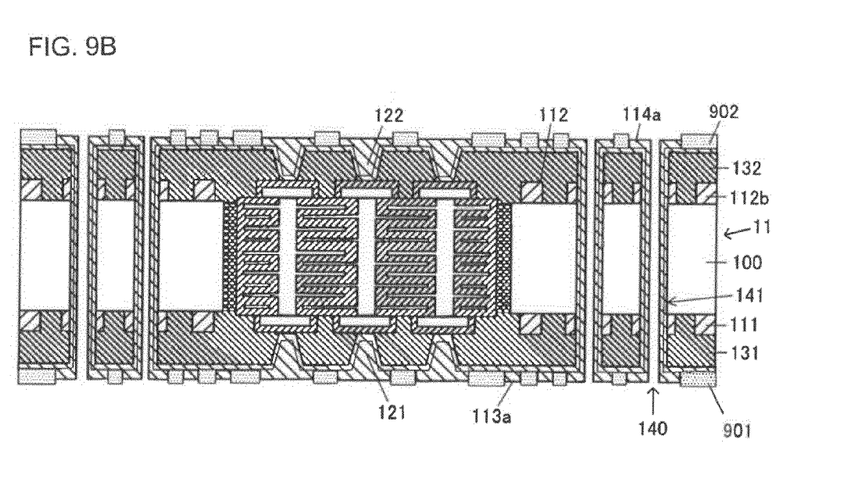
FIG. 9B is a cross-sectional view showing another example (a second step) to form conductive patterns on the resin insulation layers.

In the following, electrolytic copper plating is performed on the resultant substrate. As a result, as shown in FIG. 9B, electrolytic copper-plated films (113a, 114a), via conductors 121, 122 and through-hole conductors 141 are formed. Then, resist layers 901, 902 are removed and unnecessary portions of electroless copper-plated film 700 are etched away. By doing so, conductive patterns 113, 114 are formed and printed wiring board 10 is obtained as shown in FIG. 1.

Also, using a well-known build-up method or the like, a required number of resin insulation layers and wiring layers (conductive patterns) are further laminated on printed wiring board 10 shown in FIG. 1, and a further multilayered printed wiring board may be manufactured.

Also, adhesive layer 502 is formed on both surfaces of jig plate 501, and printed wiring boards may be manufactured on both such surfaces at the same time.

Also, after mounting core substrate 11 on adhesive sheet 500, chip capacitor 20 may be mounted on adhesive sheet 500 to be arranged inside opening section (100a) of substrate 11.

Also, adhesive sheet 500 does not necessarily include jig plate (support plate) 501; adhesive 500 may be formed by using only a UV tape, polyimide tape or the like.

Also, in the above embodiment, a step to form a resin insulation layer is conducted after adhesive sheet 500 is removed (see FIG. 4C). However, even before adhesive sheet 500 is removed (see FIG. 4B), it is of course possible to form a resin insulation layer on the main surface of the substrate to which adhesive sheet 500 is not adhered (for example, on the surface of the substrate shown in FIG. 4B where conductive pattern 112 is formed).

Also, the present invention may be applied in the same manner as in the above embodiment to other printed wiring boards in which not only chip capacitor 20, but also other electronic components are built, for example, passive components such as a resistor or a coil, or active components such as an IC chip made of a semiconductor element or the like. In addition, when the thickness of an electronic component is small compared with the thickness of core substrate 11, filler resin (100b) may also be adhered to the surfaces other than the side surfaces of the electronic component (such as the top surface and the bottom surface) to enhance the fixing strength.

In the above embodiment, resin insulation layers and the wiring layers (conductive patterns) are formed on both main surfaces of core substrate 11. However, resin insulation layers and wiring layers may be formed only on one main surface.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
    preparing an electronic component having a first surface and a second surface opposite the first surface, and having a first electrode formed on the first surface;
    forming in an adhesive tape a first alignment mark for mounting the electronic component;
    mounting based on the first alignment mark the electronic component on the adhesive tape in such a way that the second surface faces the adhesive side of the adhesive tape;
    forming a second alignment mark on an insulative substrate having a first surface and a second surface opposite the first surface;
    forming in the insulative substrate an opening section larger than the outer shape of the electronic component;
    mounting based on the first and second alignment marks the insulative substrate on the adhesive side of the adhesive tape in such a way that the electronic component is accommodated in the opening section of the insulative substrate;
    fixing the electronic component to the insulative substrate using resin material;
    forming a first resin insulation layer on the first surface of the insulative substrate in which the electronic component is accommodated;
    removing the adhesive tape;
    forming in the first resin insulation layer an opening that reaches the first electrode of the electronic component;
    forming a first conductive circuit on the first resin insulation layer; and
    forming in the opening of the first resin insulation layer a via conductor that is connected to the first electrode of the electronic component.

2. The method for manufacturing a printed wiring board according to claim 1, further comprising forming a through-hole that penetrates the first resin insulation layer and the insulative substrate, wherein forming the via conductor includes, on the inner wall of the through-hole, forming a through-hole conductor that is connected to the first conductive circuit.

3. The method for manufacturing a printed wiring board according to claim 1, further comprising forming a conductive circuit on the first surface of the insulative substrate, and forming in the first resin insulation layer an opening reaching a predetermined spot on that conductive circuit, wherein forming the via conductor includes, in the opening reaching that conductive circuit, forming a via conductor which connects that conductive circuit with the first conductive circuit.

4. The method for manufacturing a printed wiring board according to claim 1, wherein the first conductive circuit and the via conductor are formed simultaneously.

5. The method for manufacturing a printed wiring board according to claim 1, further comprising forming a conductive layer on the first resin insulation layer, wherein the first conductive circuit is formed by etching the conductive layer.

6. The method for manufacturing a printed wiring board according to claim 1, wherein the second alignment mark is formed at the same time that a conductive circuit is formed on the first surface of the insulative substrate.

7. The method for manufacturing a printed wiring board according to claim 6, wherein the second alignment mark is formed with the same material as that of the conductive circuit on the first surface of the insulative substrate, while being set to have circuit attributes different from those of the conductive circuit.

8. The method for manufacturing a printed wiring board according to claim 1, wherein the coefficient of thermal expansion of the resin material is smaller than the coefficient of thermal expansion of the material that forms the insulative substrate.

9. The method for manufacturing a printed wiring board according to claim 8, wherein the resin material is bismaleimide resin.

10. The method for manufacturing a printed wiring board according to claim 9, wherein the bismaleimide resin contains fumed silica and polytetrafluoroethylene as filler.

11. The method for manufacturing a printed wiring board according to claim 1, further comprising, after the adhesive tape is removed, forming a second resin insulation layer on the second surface of the insulative substrate in which the electronic component is accommodated; forming a through-hole that penetrates the first and second resin insulation layers and the insulative substrate; and forming a second conductive circuit on the second resin insulation layer, while on the inner wall of the through-hole forming a through-hole conductor that connects the first and second conductive circuits, wherein forming the through-hole conductor is included in forming the via conductor.

12. The method for manufacturing a printed wiring board according to claim 11, wherein a second electrode is formed on the second surface of the electronic component.

13. The method for manufacturing a printed wiring board according to claim 12, further comprising forming in the second resin insulation layer an opening that reaches the second electrode of the electronic component, wherein a via conductor connecting the second conductive circuit and the second electrode of the electronic component is formed in the opening of the second resin insulation layer at the same time that the second conductive circuit is formed.

14. The method for manufacturing a printed wiring board according to claim 11, further comprising forming a conductive circuit on the second surface of the insulative substrate, and forming in the second resin insulation layer an opening which reaches a predetermined spot on that conductive circuit, wherein a via conductor connecting that conductive circuit with the second conductive circuit is formed in the opening of the second resin insulation layer at the same time that the through-hole conductor is formed.

* * * * *